United States Patent
Jennings

(10) Patent No.: US 11,153,965 B1
(45) Date of Patent: Oct. 19, 2021

(54) INTEGRATED VAPOR CHAMBER PRINTED CIRCUIT BOARD (PCB) ASSEMBLY

(71) Applicant: Rockwell Collins, Inc., Cedar Rapids, IA (US)

(72) Inventor: Martin J. Jennings, Oxford, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 16/683,671

(22) Filed: Nov. 14, 2019

(51) Int. Cl.
*H05K 1/02* (2006.01)
*H05K 7/20* (2006.01)

(52) U.S. Cl.
CPC ....... *H05K 1/0204* (2013.01); *H05K 7/20809* (2013.01); *H05K 2201/064* (2013.01)

(58) Field of Classification Search
CPC ..... F28D 15/04; H01L 23/427; H05K 1/0203; H05K 1/0204; H05K 1/0206; H05K 1/0207; H05K 1/0209; H05K 7/20809; H05K 2201/064
See application file for complete search history.

(56) References Cited

U.S. PATENT DOCUMENTS

| | | | | |
|---|---|---|---|---|
| 9,894,803 B1* | 2/2018 | Artis | ................. | H05K 7/20409 |
| 9,897,393 B2 | 2/2018 | Lan | | |
| 10,077,945 B2 | 9/2018 | Lan | | |
| 10,107,557 B2 | 10/2018 | Lan | | |
| 2009/0065180 A1* | 3/2009 | Wits | ..................... | H05K 1/0203 |
| | | | | 165/104.26 |
| 2010/0328891 A1* | 12/2010 | Campbell | .......... | H05K 7/20809 |
| | | | | 361/700 |
| 2011/0108245 A1 | 5/2011 | Tan et al. | | |
| 2011/0120674 A1* | 5/2011 | MacDonald | ............ | F28D 15/04 |
| | | | | 165/104.26 |
| 2014/0311713 A1* | 10/2014 | Wu | ...................... | H05K 1/0209 |
| | | | | 165/104.32 |
| 2016/0081178 A1* | 3/2016 | D'Onofrio | ......... | H05K 7/20218 |
| | | | | 361/699 |
| 2017/0318702 A1* | 11/2017 | Basu | ................... | F28D 15/0233 |
| 2017/0338167 A1* | 11/2017 | Bozorgi | ................ | F28F 21/086 |
| 2018/0153030 A1* | 5/2018 | Viswanathan | ........... | H05K 3/32 |

(Continued)

OTHER PUBLICATIONS

Cho, Sangbeom, "Thermal Performance Enhancement of Packaging Substrates with Integrated Vapor Chamber", A Dissertation Presented to the Academic Faculty, Georgia Institute of Technology, May 2018, 158 pages.

*Primary Examiner* — Jacob R Crum
(74) *Attorney, Agent, or Firm* — Suiter Swantz pc llo

(57) ABSTRACT

A circuit card assembly (CCA) is disclosed. In embodiments, the CCA includes a printed circuit board (PCB) comprising a series of adjacent substrate layers. Evaporator layers include an evaporator surface thermally connected to CCA components and capable of absorbing heat therefrom. A series of wall layers include apertures collectively defining an integrated vapor chamber extending between the evaporator layers and condenser layers including a condenser surface opposite the evaporator surface. A working fluid within the vapor chamber is boiled by heat transferred from the evaporator surface and re-condenses at the condenser surface, which transfers heat from the working fluid. The re-condensed working fluid is transitioned back to the evaporator surface via capillary wick structures within the internal surfaces of vapor chamber.

11 Claims, 6 Drawing Sheets

(56) References Cited

U.S. PATENT DOCUMENTS

| | | | |
|---|---|---|---|
| 2018/0164043 A1* | 6/2018 | Kurashima | F28D 15/0233 |
| 2019/0348345 A1* | 11/2019 | Parida | H01L 21/4882 |
| 2019/0387643 A1* | 12/2019 | Jeffers | F28D 15/02 |
| 2020/0015384 A1* | 1/2020 | Tivadar | H05K 7/20254 |

* cited by examiner

INTEGRATED VAPOR CHAMBER PRINTED CIRCUIT BOARD (PCB) ASSEMBLY

TECHNICAL FIELD

Embodiments of the inventive concepts disclosed herein are directed generally to integrated circuit card assemblies (CCA) and more particularly to heat and power dissipation for thermally sensitive integrated circuit packages.

BACKGROUND

Decreased integrated circuit (IC) package sizes and increased power/heat dissipation needs require new approaches to thermal management. Conventional solutions for cooling thermally sensitive chips, circuits, dies, and packages generally involve conducting heat through the top of the package and into a surrounding chassis structure or heatsink assembly. However, this approach falls short when components rely on an exposed printed circuit board (PCB) pad to transfer heat into the PCB itself. Further, a generally reduced PCB temperature benefits the circuit card assembly (CCA) as a whole by lowering the temperature of any CCA components installed on the PCB.

SUMMARY

A circuit card assembly (CCA) is disclosed. In embodiments, the CCA includes a multi-layer printed circuit board (PCB) formed of adjacent substrate layers coupled in series. Within the substrate layers the CCA incorporates an evaporator surface in thermal communication with a proximate integrated circuit (IC) package or other like CCA component; the evaporator surface absorbs heat generated by the component and serves as an initial (e.g., evaporator) end of a vapor chamber formed within the substrate layers. For example, a series of adjacent wall layers may each incorporate apertures which serially form the interior of the vapor chamber. The vapor chamber includes a working fluid sealed within, such that the working fluid absorbs transferred heat from the evaporator surface and boils in the process. The CCA incorporates, at an opposing or terminal end of the vapor chamber, a condenser surface at which the working fluid condenses, its transferred heat absorbed by the condenser surface for transfer or dissipation outside the CCA. The vapor chamber incorporates a capillary or wick structure for collecting the condensed working fluid and returning the working fluid to the evaporator surface.

A circuit card assembly (CCA) is also disclosed. In embodiments, the CCA incorporates a multi-layer printed circuit board (PCB) comprising a series of adjacent substrate layers. The substrate layers include a thermal layer defining an end (e.g., an evaporator surface defining an evaporator end, or a condenser surface defining a condenser end) of a vapor chamber disposed within the substrate layers. A series of wall layers, each wall layer having an aperture within, serially define the interior of the vapor chamber. The vapor chamber ends at a second thermal layer (e.g., which includes a condenser surface opposite the evaporator surface, or an evaporator surface opposite the condenser surface). The vapor chamber includes a working fluid sealed within and capable of absorbing heat from the evaporator surface, boiling in the process, and transferring the absorbed heat by condensing at the condenser surface. A capillary or wick structure within the vapor chamber returns the condensed working fluid to the evaporator surface.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
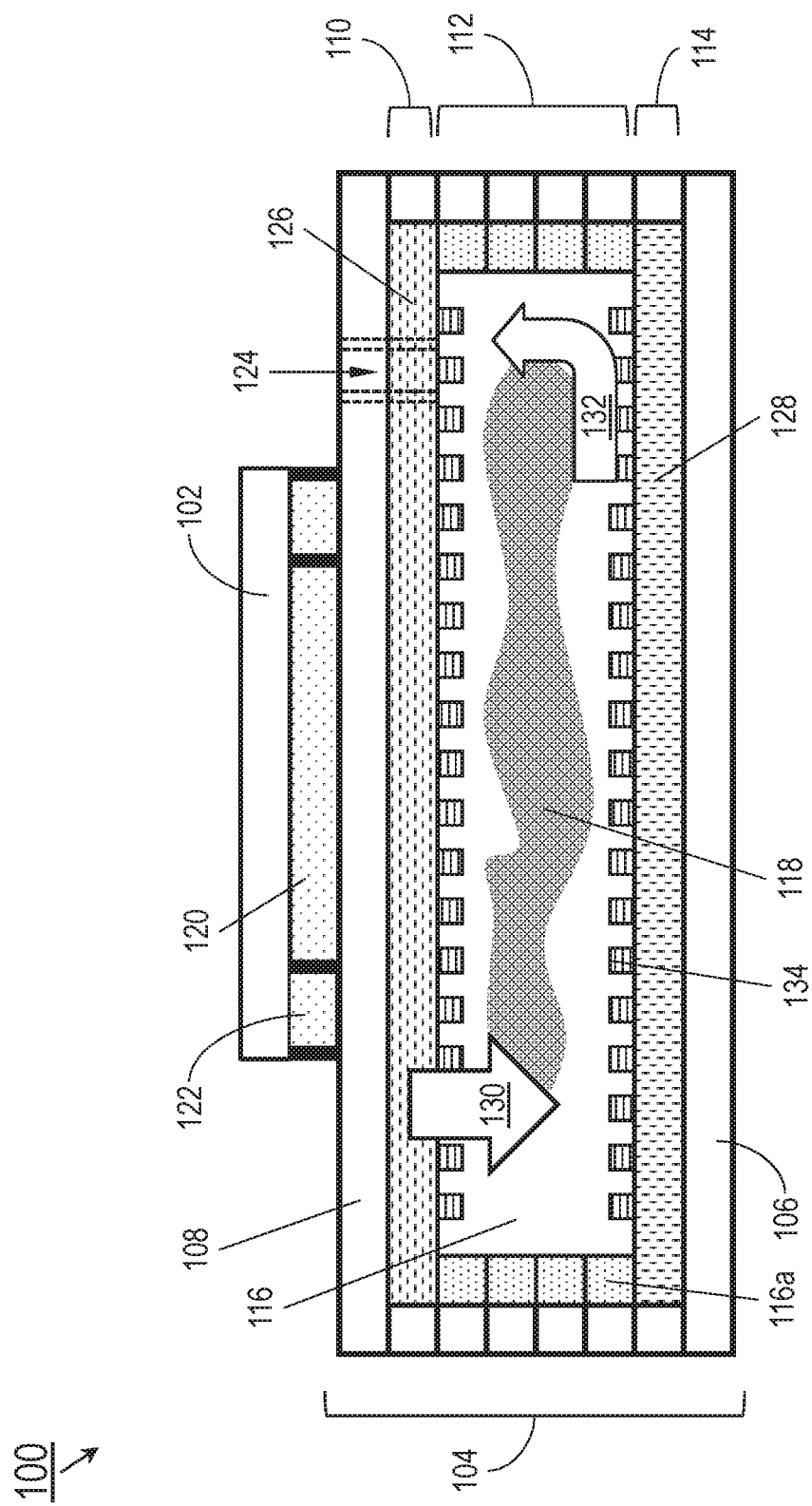
FIG. 1 is a cross-sectional diagrammatic illustration of a circuit card assembly (CCA) in accordance with example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Figure 2:
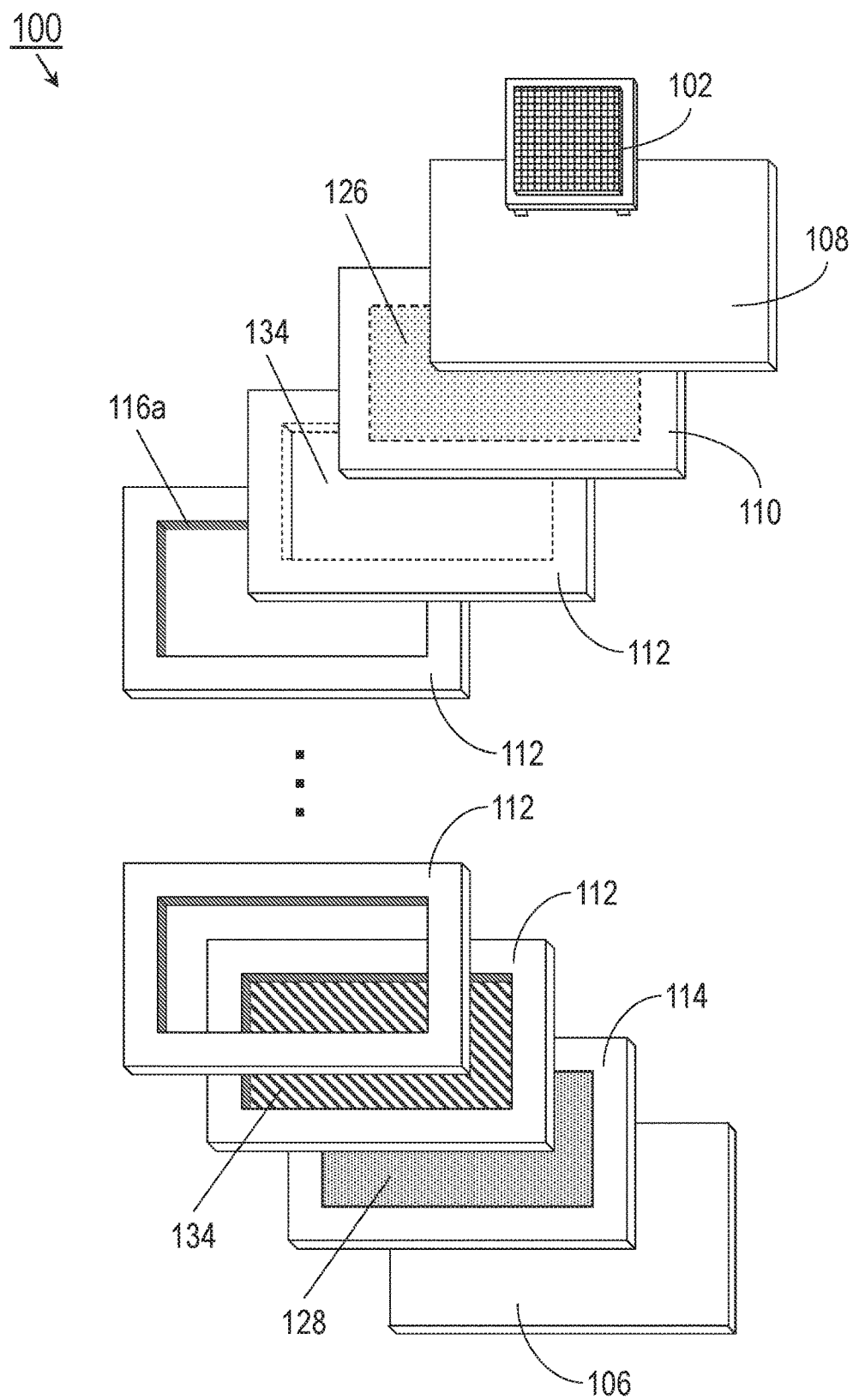
FIG. 2 is an isometric exploded illustration of the CCA of FIG. 1.

Referring to FIGS. 1 and 2, a circuit card assembly 100 (CCA) is disclosed. The CCA 100 may include an integrated circuit (IC) package 102 mounted to a printed circuit board 104 (PCB; e.g., printed wiring board (PWB)), the PCB 104 including bottom layers 106, top layers 108, evaporator layers 110, wall layers 112, condenser layers 114, and a vapor chamber 116 enclosing a working fluid 118.

In embodiments, the IC package 102 (e.g., or other thermally sensitive components) may be mounted to the PCB 104 and optimized for heat transfer into the PCB. For example, the IC package 102 may be a quad flat no-leads (QFN) or dual flat no-leads (DFN) package incorporating exposed thermal pads 120, package leads 122, solder pads (e.g., via which the IC package 102 may be mounted to the PCB), and any other appropriate means of conducting heat from the IC package 102 toward the evaporator layers 110.

In embodiments, the vapor chamber 116 may be integrated into the PCB 104 between the condenser layers 114 and evaporator layers 110. However, instead of using metal shells brazed together to form a sealed volume, as is the case with conventional vapor chambers, the vapor chamber 116 may be integrated into the internal geometry of the PCB 104 on a layer-by-layer basis. In some embodiments, the vapor chamber 116 may incorporate fine geometric structures due to this fabrication technique, allowing for the realization of intricate chamber structures through the sequential application of fine wall layers 112. For example, the wall layers 112 may extend serially between the condenser layers 114 and evaporator layers 110, each wall layer incorporating an aperture therein such that the series of wall layers may collectively define one or more walls (116a) enclosing the vapor chamber 116 between the evaporator and condenser layers. Accordingly, the vapor chamber 116 may be simple or complex in shape, depending upon operational demands.

In embodiments, once the vapor chamber 116 has been constructed within the PCB 104, a working fluid 118 may be introduced into the vapor chamber through a fluid via 124 drilled through either the top layers 108 or bottom layers 106 (e.g., exposed PCB surface, top and bottom exterior substrates) into the vapor chamber and sealed once the working fluid has been introduced. The working fluid 118 may include, but is not limited to, alcohols, ethyls, or any other appropriate fluid selected for its particular operating temperatures or properties. For example, the evaporator layers 110 may incorporate an evaporator surface 126 defining an evaporator end of the vapor chamber 116. The evaporator surface 126 is capable of absorbing heat transferred from the IC package 102 (e.g., through the thermal pads 120, thermal vias 122, or solder pads). Heat absorbed by the evaporator surface 126 may cause the working fluid 118 to boil. The working fluid 118 may, in vapor form, collect and condense at a condenser surface 128 incorporated into the condenser layers 114, the condenser surface is conductively or thermally connected to a heatsink (e.g., cold reservoir) external to the PWB 104, such that heat may be rapidly and efficiently transferred (130) from the IC package 102 (e.g., or other components) through the vapor chamber 116 and heatsink. In some embodiments, the orientation of the upper and lower thermal layers may be reversed. For example, the IC package 102 may be attached (and the evaporator surface 126 proximate to) the bottom layer 106, and the condenser surface 128 proximate to the top layer 108.

In embodiments, the working fluid 118, having condensed at the condenser surface 128 and transferred heat thereto, may return (132) to the evaporator surface 126 via capillary structures 134 (e.g., wick structures) within the internal surfaces of the vapor chamber 116. For example, the capillary structures 134 take advantage of the capillary force of the working fluid 118 to transition the condensed fluid from the condenser surface 128 against gravity to the evaporator surface 126, where the working fluid 118 may once again absorb heat from the evaporator surface. The precise configuration of the capillary structures 134 may depend on, e.g., the internal geometry of the vapor chamber 116, the properties of the selected working fluid 118, or the intended installed orientation of the PWB 104 assembly.

Figure 3:
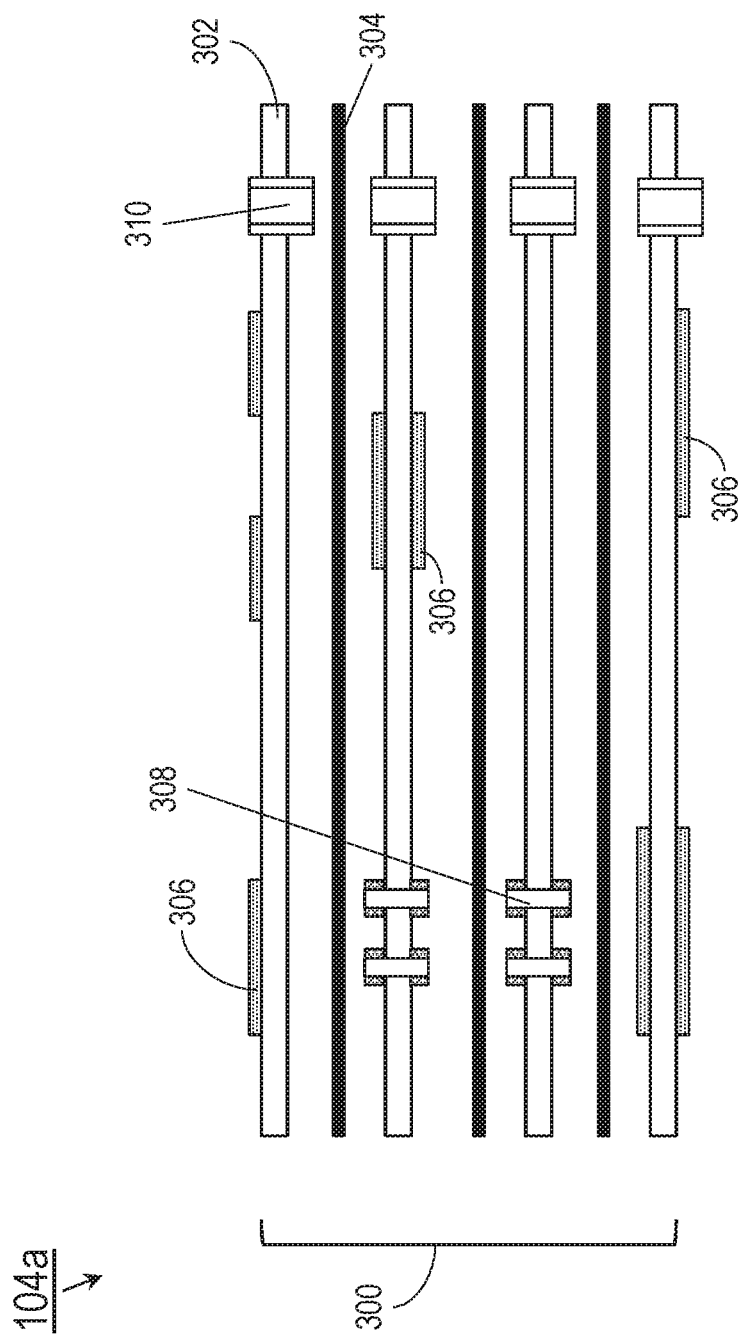
FIG. 3 is an exploded cross-sectional diagrammatic illustration of a printed circuit board (PCB) of the CCA of FIG. 1.

Referring to FIG. 3, the PCB 104a may be implemented and may function similarly to the PCB 104, except that the individual layers 300 of the PCB 104a (e.g., wall layers (112, FIGS. 1-2); evaporator layers (110, FIGS. 1-2); condenser layers (114, FIGS. 1-2); top layers (108, FIGS. 1-2); bottom layers (106, FIGS. 1-2)) may each incorporate alternating layers of dielectric material 302 and conductive pre-preg 304 (e.g., a pre-impregnated carbon fiber or similar fiber network bonded by a matrix material). In embodiments, as each subsequent layer is printed or laminated to the preceding layer, an overlaying and interfacing network of circuit traces 306 may be incorporated into the PCB 104a to provide communicative connections between the various components of the PCB. In embodiments, once an individual layer 300 or layers of the PCB 104a are laminated, one or more layers may be drilled through to create internal vias 308 and component mounting holes 310.

Figure 4:
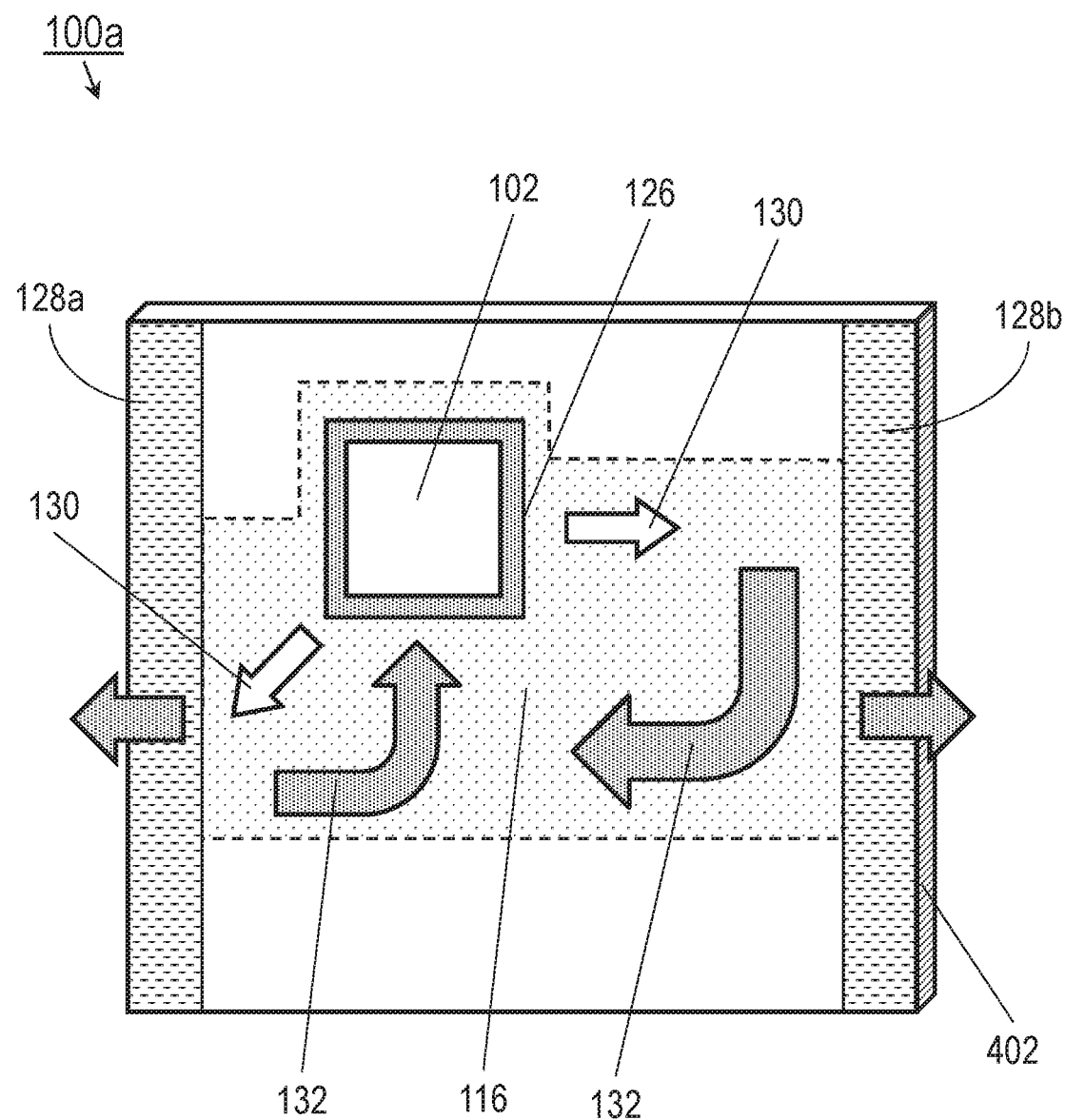
FIG. 4 is a top plan diagrammatic illustration of the CCA of FIG. 1.

Referring now to FIG. 4, the CCA 100a may be implemented and may function similarly to the CCA 100 of FIGS. 1-3, except that the CCA 100a may incorporate multiple condenser surfaces 128a-b. In embodiments, heat generated by the IC package 102 may be conducted to or absorbed by the evaporator surface 126, and therefrom transferred (130) through the integrated vapor chamber 116 (situated below the exposed PCB surface 108) to the condenser surfaces 128a-b, which may in turn be conductively cooled by a "cold reservoir". For example, the CCA 100a may be installed or mounted on a heatsink 402 capable of thermally interfacing with the condenser surfaces 128a-b. Working fluid (118, FIGS. 1-2) may be transitioned (132) back to the evaporator surface 126 (e.g., after condensation at the condenser surfaces 128a-b) via wick structures (134, FIGS. 1-2) within the integrated vapor chamber 116.

Figure 5A:
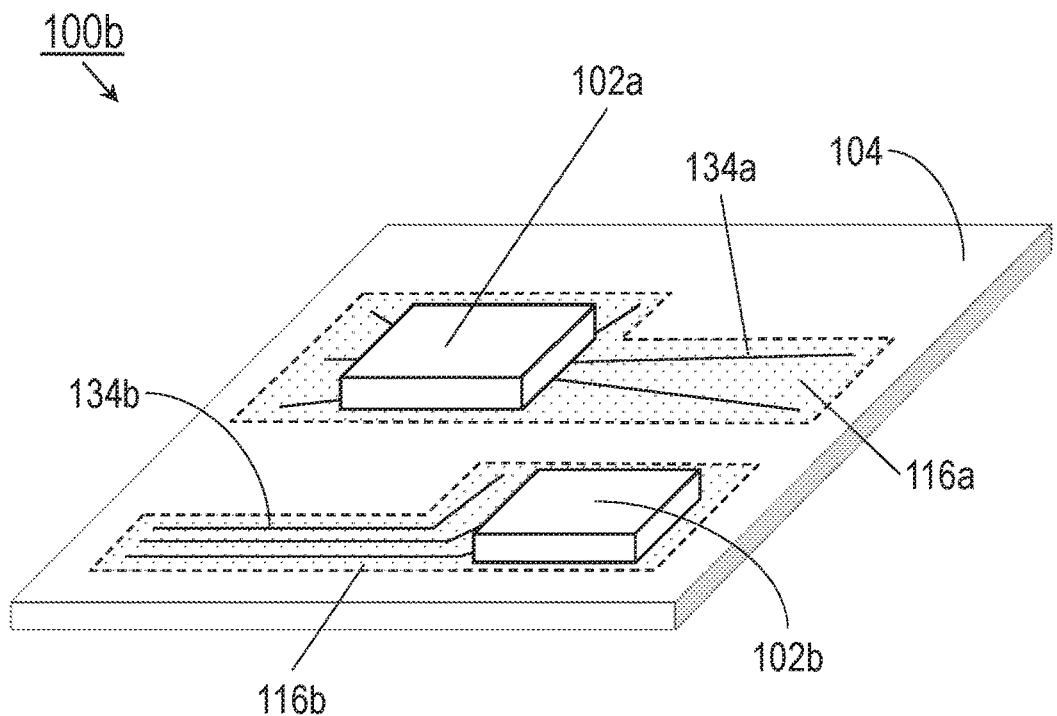
FIGS. 5A and 5B are isometric diagrammatic illustrations of the CCA of FIG. 1.

Referring to FIG. 5A, the CCA 100b may be implemented and may function similarly to the CCAs 100, 100a of FIGS. 1-4, except that the PCB 104 of the CCA 100b may incorporate multiple IC packages 102a-b.

In embodiments, the PCB 104 of the CCA 100b may incorporate multiple integrated vapor chambers 116a-b. For example, each of the vapor chambers 116a-b may be independently tuned based on the thermal characteristics of its associated IC package 102a-b. Each vapor chamber 116a-b may incorporate, e.g., distinct footprints; distinct evaporator and condenser surfaces (126 and 128, FIGS. 1-2); distinct capillary structures 134a-b (e.g., wick geometries); distinct working fluids (118, FIG. 1) to maximize the thermal efficiency of the CCA 100b with respect to the IC packages 102a-b or any other high-power components incorporated by the CCA and having thermal dissipation needs.

Figure 5B:
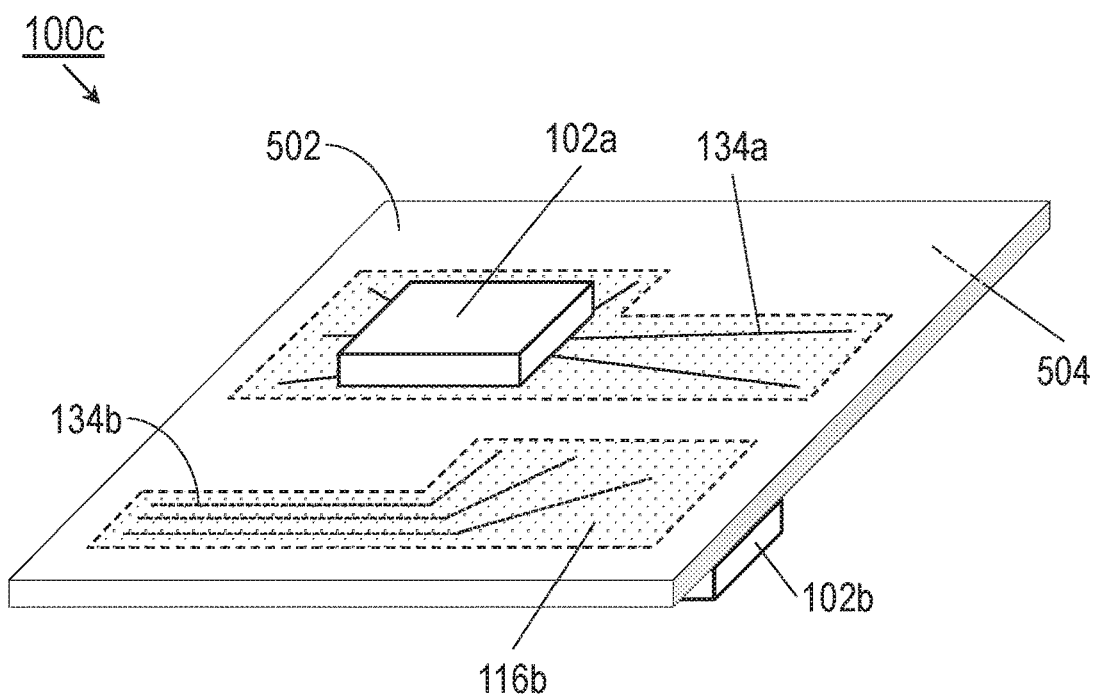

Referring to FIG. 5B, the CCA 100c may be implemented and may function similarly to the CCA 100b of FIG. 5A, except that the CCA 100c may incorporate IC packages 102a-b on opposing exposed PCB surfaces 502, 504 and requiring through-board thermal dissipation. In embodiments, the vapor chambers 116a-b and capillary structures 134a-b associated with each IC package 102a-b may be oriented accordingly.

Figure 5C:
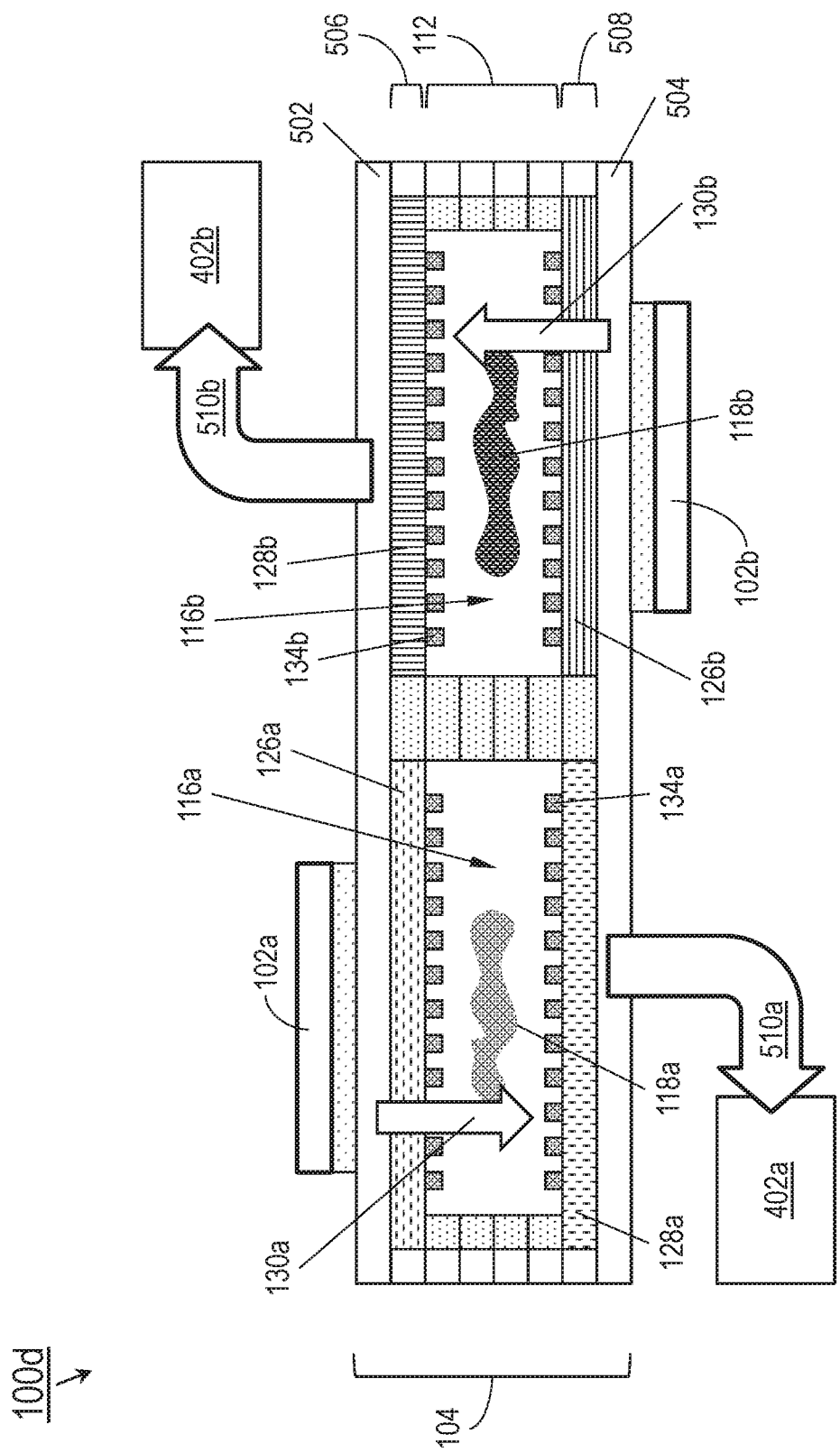
FIG. 5C is a cross-sectional diagrammatic illustration of the CCA of FIG. 5B.

Referring to FIG. 5C, the CCA 100d may be implemented and may function similarly to the CCA 100c of FIG. 5B, except that the CCA 100d may incorporate multiple vapor chambers 116a-b within the individual layers of the PCB 104.

In embodiments, the PCB 104 of the CCA 100d may incorporate thermal layers 506, 508 on either end of the wall layers 112 and defining the bounds of the vapor chambers 116a-b. For example, similarly to the CCA 100 of FIGS. 1 and 2, the thermal layer 506 may incorporate an evaporator surface 126a proximate to, and in thermal communication with, an IC package 102a mounted to the top side (e.g., exposed PCB surface 502) of the CCA 100d. As noted above, the evaporator surface 126a may absorb heat from the IC package 102a and transfer the absorbed heat (130a) via the working fluid 118a sealed within the vapor chamber 116a, to a condenser surface 128a disposed within the thermal layer 508. The vapor chamber 116a may further incorporate a capillary structure 134a for returning the condensed working fluid 118a to the evaporator surface 126a. The condenser surface 128a may be in thermal communication (510a) with a heatsink device 402a external to the PCB 104 and capable of receiving, and dissipating, the absorbed heat from the condenser surface.

In embodiments, the thermal layer 508 may further incorporate a second evaporator surface 126b in thermal communication with a second CCA component (e.g., a second IC package 102b) mounted to the bottom side (e.g., exposed PCB surface 504) of the CCA 100d. For example, the second evaporator surface 126b may define an evaporator end of a second vapor chamber 116b, the shape of which (and the working fluid 118b sealed within) may be tuned to specifications different from those of the vapor chamber 116a and working fluid 118a. Similarly, the thermal layer 506 may incorporate a condenser surface 128b (in thermal communication 510b with an external heatsink device 402b), such that the direction of heat transfer 130b through the vapor chamber 116b (via the working fluid 118b) is opposite the direction of heat transfer 130a through the vapor chamber 116a.

In some embodiments, additional evaporator and condenser surfaces 126b, 128b defining additional vapor chambers 116b may be situated within the wall layers 112, such that all vapor chambers 116a-b within a particular PCB 104 may not be of identical height or volume.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

I claim:
1. A circuit card assembly (CCA), comprising:
   a printed circuit board (PCB) comprising a plurality of adjacent substrate layers serially coupled and extending from a top exterior substrate to a bottom exterior substrate, the plurality of substrate layers including:
   a first evaporator layer including a first evaporator surface thermally coupled to at least one first component of the CCA by at least one of a thermal pad or a thermal via, the first evaporator surface configured for absorbing heat from the at least one first component and defining an evaporator end of a first vapor chamber within the PCB, the at least one first component coupled to the top exterior substrate;
   a plurality of sequentially applied wall layers extending serially between the first evaporator layer and a first condenser layer, each wall layer including at least one of:
      a first aperture, the plurality of first apertures and the plurality of wall layers collectively configured for defining the first vapor chamber;
      or
      a first capillary structure disposed within the first vapor chamber and coupled to the evaporator surface;
   the at least one first condenser layer coupled to the at least one first capillary structure and including a first condenser surface defining a condenser end of the first vapor chamber;
   a second evaporator layer including a second evaporator surface in thermal communication with at least one second component of the CCA, the second evaporator surface configured for absorbing heat from the at least one second component and defining an evaporator end of a second vapor chamber within the PCB;
   at least one second aperture within the plurality of wall layers and adjacent to the second evaporator surface, the at least one second aperture configured for defining a second vapor chamber;
   a second condenser layer adjacent to the at least one second aperture, the second condenser layer including a second condenser surface defining a condenser end of the second vapor chamber; and
   a working fluid disposed within the first vapor chamber and the second vapor chamber, the working fluid configured for transferring the absorbed heat from the first or second evaporator surface to the first or second condenser surface, the first or second capillary structure configured to:
collect the working fluid in a condensed state; and
transmit the collected working fluid to the first or second evaporator surface.

2. The CCA of claim 1, wherein the component includes at least one integrated circuit (IC) package.

3. The CCA of claim 1, wherein the second component is coupled to the bottom exterior substrate.

4. The CCA of claim 1, wherein the one or more wall layers include at least one of:
a layer trace in communication with the at least one first or second component;
an internal via;
or
a component mounting hole associated with the at least one first or second component.

5. The CCA of claim 1, wherein at least one of the first or second condenser surface is in thermal communication with at least one heatsink device external to the PCB, the heatsink device configured for dissipation of the transferred heat from the condenser surface.

6. A circuit card assembly (CCA), comprising:
a printed circuit board (PCB) comprising a plurality of adjacent substrate layers serially coupled, the plurality of substrate layers including:
a first vapor chamber disposed within the plurality of adjacent substrate layers, the first vapor chamber comprising:
a first evaporator layer including an evaporator surface in thermal communication with at least one first CCA component and configured to absorb heat from the at least one CCA component;
a plurality of sequentially applied wall layers extending serially between the first evaporator layer and a first condenser layer, each wall layer including at least one of:
a first aperture, the plurality of first apertures and the plurality of wall layers collectively configured for defining the first vapor chamber;
or
a first capillary structure disposed within the first vapor chamber and coupled to the evaporator surface;
at least one first condenser layer defining a second end of the first vapor chamber, the first condenser layer including a condenser surface coupled to the at least one capillary structure;
and
a working fluid disposed within the first vapor chamber, the working fluid configured for transferring absorbed heat between the first evaporator surface and the condenser surface, the at least one capillary structure configured to collect the working fluid in a condensed state and return the working fluid to the evaporator surface;
and
at least one second vapor chamber disposed within the plurality of adjacent substrate layers, the second vapor chamber comprising:
at least one second evaporator layer including an evaporator surface in thermal communication with at least one second CCA component and configured to absorb heat from the at least one second CCA component;
a plurality of sequentially applied wall layers extending serially between the second evaporator layer and a second condenser layer, each wall layer including at least one of:
a second aperture, the plurality of second apertures and the plurality of wall layers collectively configured for defining the second vapor chamber;
or
a second capillary structure disposed within the second vapor chamber and coupled to the evaporator surface;
the second condenser layer defining a second end of the second vapor chamber, the second condenser layer including a condenser surface coupled to the at least one second capillary structure;
and
a working fluid disposed within the second vapor chamber, the working fluid configured for transferring absorbed heat between the second evaporator layer and the second condenser layer, the at least one capillary structure configured to collect the working fluid in a condensed state and return the working fluid to the evaporator surface.

7. The CCA of claim 6, wherein the at least one first CCA and the at least one second CCA component include at least one integrated circuit (IC) package.

8. The CCA of claim 6, wherein the first condenser surface is in thermal communication with at least one heatsink and configured for transferring the absorbed heat thereto.

9. The CCA of claim 6, wherein the condenser surface of the second vapor chamber is in thermal communication with at least one heatsink and configured for transferring the absorbed heat thereto.

10. The CCA of claim 6, wherein:
the second condenser layer and the first evaporator layer share a common thermal layer.

11. The CCA of claim 6, wherein:
the working fluid of the first vapor chamber is configured for transferring the absorbed heat in a first direction;
and
the working fluid of the second vapor chamber is configured for transferring the absorbed heat in a second direction opposite the first direction.

* * * * *